United States Patent
Hsu et al.

(10) Patent No.: US 8,772,922 B2
(45) Date of Patent: Jul. 8, 2014

(54) CHIP STRUCTURE HAVING REDISTRIBUTION LAYER

(75) Inventors: Hung-Yuan Hsu, Taichung (TW); Sui-An Kao, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 364 days.

(21) Appl. No.: 13/349,051

(22) Filed: Jan. 12, 2012

(65) Prior Publication Data

US 2012/0112363 A1  May 10, 2012

Related U.S. Application Data

(62) Division of application No. 12/962,326, filed on Dec. 7, 2010, now Pat. No. 8,097,491.

(30) Foreign Application Priority Data

Sep. 23, 2010 (TW) .............................. 99132146 A

(51) Int. Cl.
- H01L 21/44 (2006.01)
- H01L 21/461 (2006.01)
- H01L 21/302 (2006.01)

(52) U.S. Cl.
USPC ........... 257/686; 257/690; 257/723; 257/777; 257/E21.021; 257/E23.085

(58) Field of Classification Search
None
See application file for complete search history.

(56) References Cited

U.S. PATENT DOCUMENTS

| | | |
|---|---|---|
| 7,170,160 B1 | 1/2007 | Wang |
| 7,781,878 B2 | 8/2010 | Chen et al. |
| 2003/0094683 A1 | 5/2003 | Poo et al. |
| 2004/0156172 A1* | 8/2004 | Lin et al. ................. 361/704 |
| 2005/0167798 A1 | 8/2005 | Doan |
| 2007/0158807 A1* | 7/2007 | Lu et al. ................. 257/686 |
| 2008/0036067 A1 | 2/2008 | Lin |
| 2010/0025825 A1* | 2/2010 | DeGraw et al. ......... 257/621 |

* cited by examiner

*Primary Examiner* — Mohsen Ahmadi
(74) *Attorney, Agent, or Firm* — Edwards Wildman Palmer LLP; Peter F. Corless; Steven M. Jensen

(57) ABSTRACT

A chip structure having a redistribution layer includes: a chip with electrode pads disposed on an active surface thereof; a first passivation layer formed on the active surface and the electrode pads; a redistribution layer formed on the first passivation layer and having a plurality of wiring units, wherein each of the wiring units has a conductive pad, a conductive via and a conductive trace connecting the conductive pad and the conductive via, the conductive trace having at least a first through opening for exposing a portion of the first passivation layer; and a second passivation layer disposed on the first passivation layer and the redistribution layer, the second passivation layer being filled in the first through opening such that the first and second passivation layers are bonded to each other with the conductive trace sandwiched therebetween, thereby preventing delamination of the conductive trace from the second passivation layer.

4 Claims, 4 Drawing Sheets

CHIP STRUCTURE HAVING REDISTRIBUTION LAYER

CROSS-REFERENCES TO RELATED APPLICATIONS

This application is a divisional of application U.S. Ser. No. 12/962,326, filed on Dec. 7, 2010, issued as U.S. Pat. No. 8,097,491 on Jan. 17, 2012, which claims under 35 U.S.C. §119(a) the benefit of Taiwanese Application No. 099132146, filed Sep. 23, 2010, the entire contents of which are incorporated herein by reference.

BACKGROUND OF THE INVENTION

1. Field of the Invention

The present invention relates to chip structures and fabrication methods thereof, and more particularly, to a chip structure having a redistribution layer and a fabrication method thereof.

2. Description of Related Art

Along with the development of electronic industries, electronic products have a trend towards multi-function and high performance. Currently, packaging substrates for carrying semiconductor chips can be such as wire bonding packaging substrates, chip scale packaging (CSP) substrates, flip chip ball grid array (FCBGA) packaging substrates and so on. To meet operational demands of microprocessors, chipsets and graphic chips, it is necessary to improve functions of the packaging substrates in chip signal transmission, improving bandwidth and controlling impedance so as to meet the development of packages with high I/O count.

Conventionally, a semiconductor chip with a plurality of electrode pads on a surface thereof is disposed to a packaging substrate with a plurality of conductive pads corresponding to the electrode pads, and a plurality of conductive bumps or other conductive adhesive material or gold wires are disposed between the semiconductor chip and the packaging substrate so as to electrically connect the semiconductor chip to the packaging substrate.

Further, a plurality of semiconductor packages can be stacked together to meet requirements for multi-function and high operating efficiency. In addition, redistribution layer (RDL) technology can be used to effectively utilize chip area so as to improve performance.

For example, U.S. Pat. No. 7,170,160 discloses a chip structure having a redistribution layer, wherein a plurality of chips is stacked together and electrically connected to each other through bonding wires.

FIG. 1A is an upper view of the chip structure as disclosed by U.S. Pat. No. 7,170,160, and FIG. 1B is a cross-sectional view of the chip structure. Referring to FIGS. 1A and 1B, a chip 10 with a plurality of electrode pads 11 disposed on a surface thereof is provided; a first passivation layer 12a is formed to cover the chip 10 and the electrode pads 11, and a plurality of first openings 120a is formed in the first passivation layer 12a for exposing the electrode pads 11, respectively; a redistribution layer 13 is formed on the first passivation layer 12a and conductive vias 130 are formed in the first openings 120a for electrically connecting to the electrode pads 11, respectively, wherein the redistribution layer 13 has a plurality of conductive pads 131 and widened portions 132, the widened portions 132 being used for improving the electrical performance of the structure; further, a second passivation layer 12b is formed to cover the first passivation layer 12a and the redistribution layer 13 and has a plurality of second openings 120b for exposing the conductive pads 131, respectively.

However, since the widened portions 132 having a large area are made of a metal material while the first passivation layer 12a or the second passivation layer 12b is made of a non-metal material, the bonding between the widened portion 132 and the second passivation layer 12b is quite poor, which easily results in delamination of the widened portions 132 from the second passivation layer 12b and thus reduces the quality of the electrical connection.

Therefore, it is imperative to provide a chip structure having a redistribution layer and a fabrication method thereof so as to overcome the above-described drawback.

SUMMARY OF THE INVENTION

Accordingly, the present invention provides a chip structure having a redistribution layer and a fabrication method thereof so as to prevent delamination of a widened portion of a redistribution layer from a second passivation layer.

In order to achieve the above and other objects, the present invention provides a chip structure having a redistribution layer, which comprises: a chip having an active surface with a plurality of electrode pads and an inactive surface opposite to the active surface; a first passivation layer formed on the active surface and the electrode pads and having a plurality of first openings for exposing the electrode pads, respectively; a redistribution layer formed on the first passivation layer and having a plurality of wiring units, wherein each of the wiring units comprises a conductive pad, a conductive via formed in one of the first openings and a conductive trace connecting the conductive pad and the conductive via, the conductive trace having at least a first through opening for exposing a portion of the first passivation layer; and a second passivation layer formed on the first passivation layer and the redistribution layer and filled in the at least a first through opening of the conductive trace of each of the wiring units and having a plurality of second openings for exposing the conductive pad of each of the wiring units.

Therein, the redistribution layer can be comprised of a seed layer and a metal layer disposed in sequence.

The present invention further provides a fabrication method of a chip structure having a redistribution layer, which comprises the steps of: providing a chip having an active surface with a plurality of electrode pads and an inactive surface opposite to the active surface; forming a first passivation layer on the active surface and the electrode pads and forming in the first passivation layer a plurality of first openings for exposing the electrode pads, respectively; forming a redistribution layer on the first passivation layer, wherein the redistribution layer has a plurality of wiring units, each of which comprises a conductive pad, a conductive via formed in one of the first openings and a conductive trace connecting the conductive pad and the conductive via, the conductive trace having at least a first through opening for exposing a portion of the first passivation layer; and forming a second passivation layer to cover the first passivation layer and the redistribution layer and filling the second passivation layer in the at least a first through opening of the conductive trace of each of the wiring units and forming a plurality of second openings in the second passivation layer for exposing the conductive pad of each of the wiring units.

In the above-described method, the step of forming the redistribution layer can further comprise the steps of: forming a seed layer on the first passivation layer, on the walls of the first openings and on the electrode pads in the first openings;

forming a photoresist layer on the seed layer and forming a plurality of openings in the photoresist layer to expose portions of the seed layer; forming a metal layer on the seed layer in the openings of the photoresist layer; and removing the photoresist layer and the seed layer covered by the photoresist layer.

Therein, the seed layer can be made of Ti/TiW/Au; and the metal layer can be made of Au.

In the above-described chip structure and the fabrication method thereof, the first through opening can be of a polygonal shape, an elliptical shape, a circular shape or a plum blossom shape.

Further, the conductive trace can have a widened portion and two elongated portions connecting the widened portion to the conductive pad and the conductive via, respectively, and the at least a first through opening can be formed in the widened portion. Furthermore, at least a second through opening can be formed in the elongated portions. In particular, the at least a second through opening can be formed in the elongated portion between the widened portion and the conductive via or formed in the elongated portion between the widened portion and the conductive pad. The at least a second through opening can be of a polygonal shape, an elliptical shape, a circular shape or a plum blossom shape.

According to the present invention, a first passivation layer is formed on an active surface of a chip with a plurality of electrode pads, and a plurality of first openings is formed in the first passivation layer so as to expose the electrode pads, respectively; then, a redistribution layer is formed on the first passivation layer so as to electrically connect to the electrode pads, wherein the redistribution layer has a plurality of wiring units each comprising a conductive pad, a conductive via formed in one of the first openings, and a conductive trace connecting the conductive pad and the conductive via, the conductive trace having at least a first through opening for exposing a portion of the first passivation layer; thereafter, a second passivation layer is formed on the first passivation layer and the redistribution layer, wherein the second passivation layer is filled in the at least a first through opening of the conductive trace of each of the wiring units such that the first and second passivation layers are bonded to each other with the conductive trace sandwiched therebetween, thereby preventing delamination of the conductive trace from the second passivation layer.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that the drawings are only for illustrative purposes and not intended to limit the present invention.

FIGS. 2A to 2G are cross-sectional views showing a chip structure having a redistribution layer and a fabrication method thereof according to the present invention.

Figure 1A:
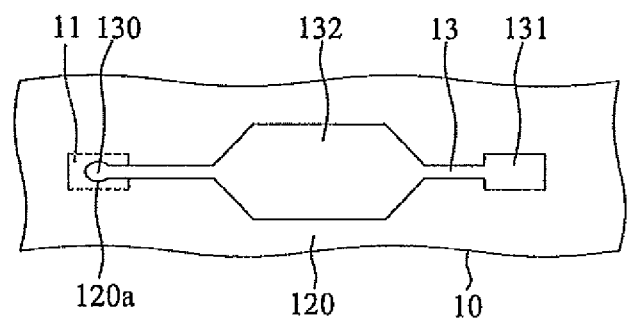
FIGS. 1A and 1B are an upper view and a cross-sectional view of a chip structure disclosed by U.S. Pat. No. 7,170,160.
Figure 1B:
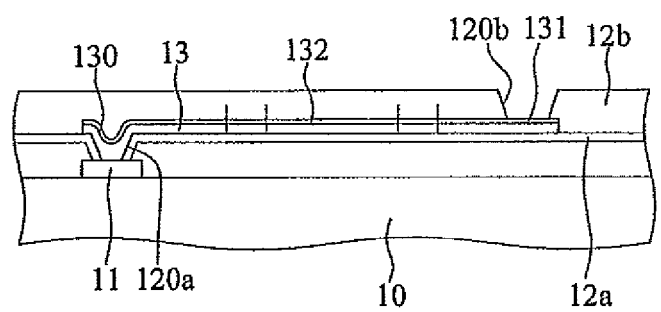
Figure 2A:
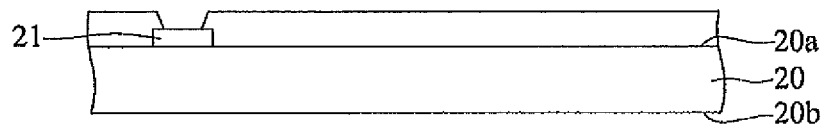
FIGS. 2A to 2G are cross-sectional views of a chip structure having a redistribution layer and a fabrication method thereof according to an embodiment of the present invention, wherein FIG. 2F' is an upper view of FIG. 2F.

Referring to FIG. 2A, a chip 20 having an active surface 20a and an opposite inactive surface 20b is provided, wherein the active surface 20a has a plurality of electrode pads 21 disposed thereon.

Figure 2B:
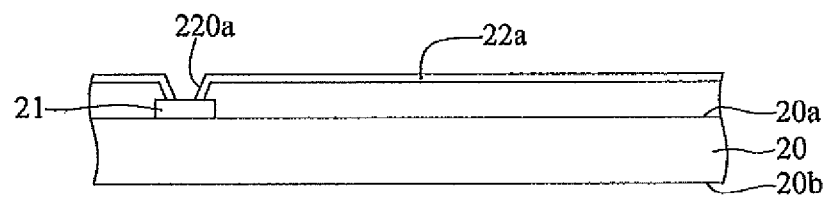

Referring to FIG. 2B, a first passivation layer 22a is formed to cover the active surface 20a and the electrode pads 21, and a plurality of first openings 220a is formed in the first passivation layer 22a to expose the electrode pads 21, respectively.

Figure 2C:
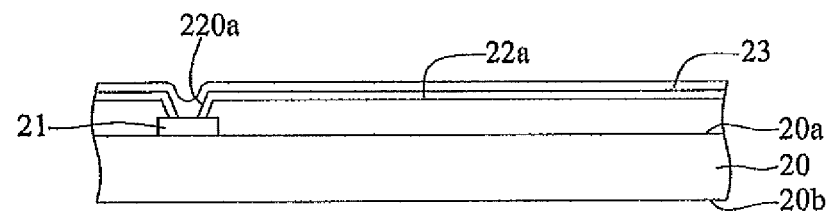

Referring to FIG. 2C, a seed layer 23 is formed on the first passivation layer 22a, on the walls of the first openings 220a and on the electrode pads 21 in the first openings 220a. The seed layer 23 can be made of Ti/TiW/Au.

Figure 2D:
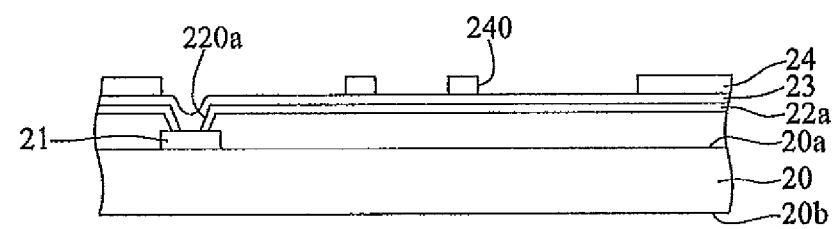

Referring to FIG. 2D, a photoresist layer 24 is formed on the seed layer 23 and a plurality of openings 240 is formed in the photoresist layer 24 so as to expose portions of the seed layer 23.

Figure 2E:
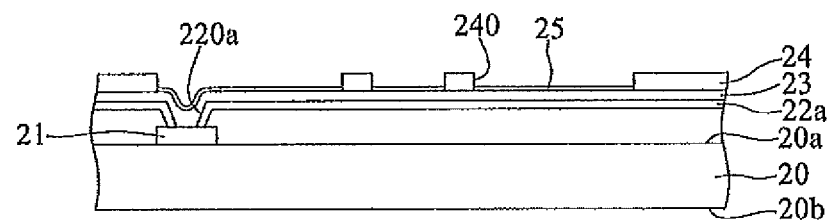

Referring to FIG. 2E, a metal layer 25 is formed on the seed layer 23 in the openings 240 of the photoresist layer 24. The metal layer 25 can be made of Au.

Figure 2F:
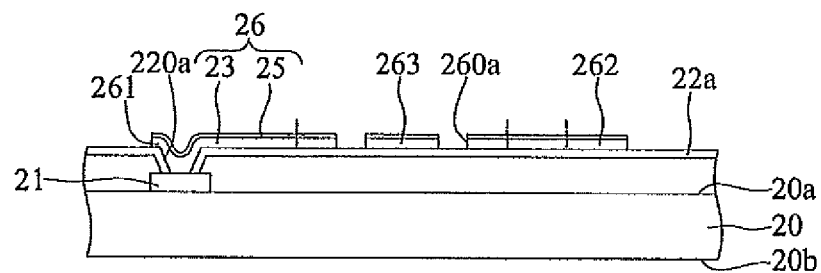
Figure 2F:
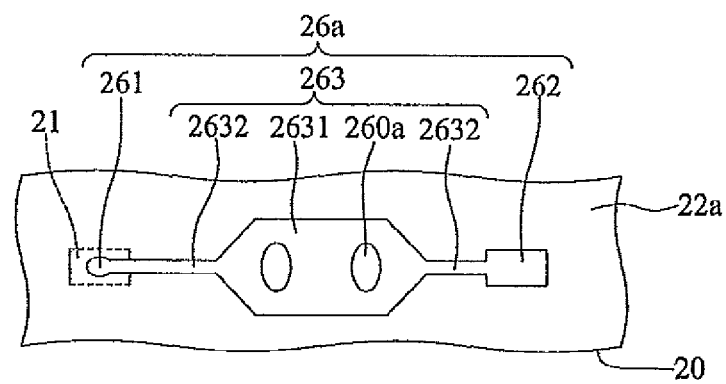

Referring to FIGS. 2F and 2F', the photoresist layer 24 and the seed layer 23 covered by the photoresist layer 24 are removed such that a redistribution layer 26 comprised of the metal layer 25 and the seed layer 23 is formed on the first passivation layer 22a. The redistribution layer 26 has a plurality of wiring units 26a. Each of the wiring units 26a comprises a conductive pad 262, a conductive via 261 formed in one of the first openings 220a for electrically connecting to the corresponding electrode pad 21, and a conductive trace 263 connecting the conductive pad 262 and the conductive via 261, wherein the conductive trace 263 has at least a first through opening 260a for exposing a portion of the first passivation layer 22a. In particular, the conductive trace 263 has a widened portion 2631 and two elongated portions 2632 connecting the widened portion 2631 to the conductive via 261 and the conductive pad 262, respectively. The first through opening 260a can be disposed on the widened portion 2631. The widened portion 2631 has at least a first through opening 260a of an elliptical shape, a polygonal shape, a circular shape or a plum blossom shape for exposing a portion of the first passivation layer 22a.

Figure 2G:
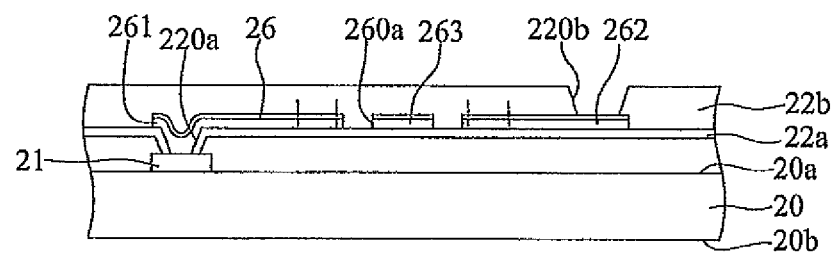

Referring to FIG. 2G a second passivation layer 22b is formed to cover the first passivation layer 22a and the redistribution layer 26 and filled in the first through opening 260a of the widened portion 2631 of the conductive trace 263 of each of the wiring units 26a such that the first and second passivation layers 22a, 22b are bonded to each other with the conductive trace 263 sandwiched therebetween, thereby preventing delamination of the widened portion 2631 of the conductive trace 263 from the second passivation layer 22b. The second passivation layer 22b is made of a material having the same characteristics as that of the first passivation layer 22a so as to achieve good bonding between the first and second passivation layers 22a, 22b. Further, a plurality of second openings 220b is formed in the second passivation layer 22b for exposing the conductive pad 262 of each of the wiring units 26a.

Figure 3A:
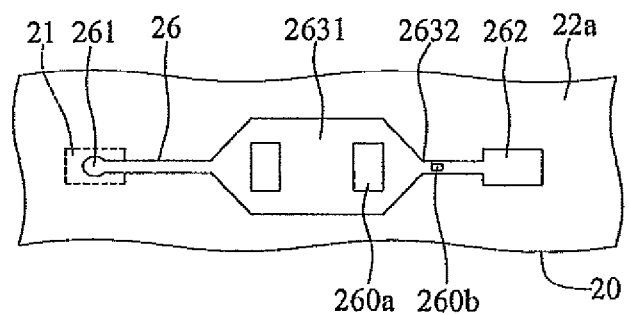
FIGS. 3A and 3B are upper views of a chip structure having a redistribution layer and a fabrication method thereof according to another embodiment of the present invention.
Figure 3B:
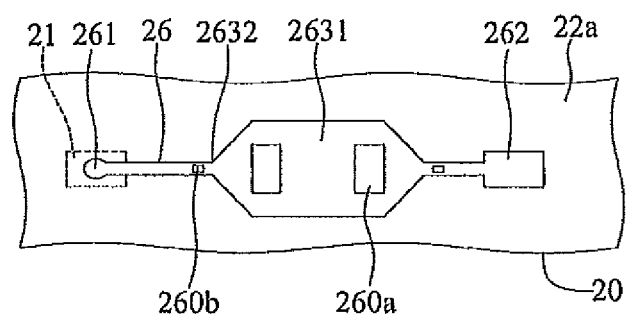

FIGS. 3A and 3B show another embodiment of the present invention, wherein the step of forming the redistribution layer 26 further comprises forming at least a second through opening 260b in the elongated portions 2632 and the first through opening 260a is of a polygonal shape. Referring to FIG. 3A, the second through opening 260b is formed in the elongate portion 2632 located between the widened portion 2631 and the conductive pad 262. Alternatively, referring to FIG. 3B, the second through opening 260b is formed in the elongated portion 2632 between the widened portion 2631 and the conductive via 261. The second through opening 260b can be of a polygonal shape, an elliptical shape, a circular shape or a plum blossom shape. The second through opening 260b allows the second passivation layer 22b to be filled therein and bonded with the first passivation layer 22a, thereby preventing delamination of the elongated portion 2632 from the second passivation layer 22b.

The present invention further provides a chip structure having a redistribution layer, which comprises: a chip 20 having an active surface 20a with a plurality of electrode pads 21 and an inactive surface 20b opposite to the active surface 20a; a first passivation layer 22a disposed on the active surface 20a and the electrode pads 21 and having a plurality of first openings 220a for exposing the electrode pads 21, respectively; a redistribution layer 26 disposed on the first passivation layer 22a and having a plurality of wiring units 26a, wherein each of the wiring units 26a comprises a conductive pad 262, a conductive via 261 formed in one of the first openings 220a, and a conductive trace 263 connecting the conductive pad 262 and the conductive via 261, the conductive trace 263 having at least a first through opening 260a so as to expose a portion of the first passivation layer 22a; and a second passivation layer 22b disposed on the first passivation layer 22a and the redistribution layer 26 and filled in the first through opening 260a of the conductive trace 263 of each of the wiring units 26a and having a plurality of second openings 220b for exposing the conductive pad 262 of each of the wiring units 26a.

In the above-described chip structure, the redistribution layer 26 is comprised of a seed layer 23 and a metal layer 25 that are disposed in sequence.

In particular, the conductive trace 263 has a widened portion 2631 and two elongated portions 2632 connecting the widened portion 2631 to the conductive via 261 and the conductive pad 262, respectively, and the first through opening 260a is disposed in the widened portion 2631. The first through opening 260a can be of a polygonal shape, an elliptical shape, a circular shape or a plum blossom shape. In addition, the chip structure further comprises a second through opening 260b disposed in the elongated portions 2632. The second through opening 260b can be of a polygonal shape, an elliptical shape, a circular shape or a plum blossom shape. Furthermore, the second through opening 260b can be disposed in the elongated portion 2632 between the widened portion 2631 and the conductive via 261 or in the elongated portion 2632 between the widened portion 2631 and the conductive pad 262.

According to the present invention, a first passivation layer is formed on an active surface of a chip with a plurality of electrode pads, and a plurality of first openings is formed in the first passivation layer so as to expose the electrode pads, respectively. Thereafter, a redistribution layer is formed on the first passivation layer and conductive vias are formed in the first openings so as to electrically connect to the electrode pads, respectively, wherein the redistribution layer has a plurality of conductive pads and at least a widened portion with at least a first through opening disposed therein for exposing a portion of the first passivation layer. Thereafter, a second passivation layer is formed on the first passivation layer and the redistribution layer, wherein the second passivation layer is filled in the first through opening of the widened portion such that the first and second passivation layers are bonded to each other with the widened portion sandwiched therebetween, thereby preventing delamination of the widened portion from the second passivation layer.

Furthermore, the redistribution layer has a second through opening disposed in an elongated portion between the widened portion and the conductive pad or in an elongated portion between the widened portion and the electrode pad so as to allow the second passivation layer to be filled therein and bonded with the first passivation layer, thereby preventing delamination of the elongated portion from the second passivation layer.

The above-described descriptions of the detailed embodiments are intended to illustrate the preferred implementation according to the present invention but are not intended to limit the scope of the present invention. Accordingly, all modifications and variations completed by those with ordinary skill in the art should fall within the scope of present invention defined by the appended claims.

What is claimed is:

1. A chip structure having a redistribution layer, comprising:
   a chip having an active surface with a plurality of electrode pads and an inactive surface opposite to the active surface;
   a first passivation layer formed on the active surface and the electrode pads and having a plurality of first openings for exposing the electrode pads, respectively;
   the redistribution layer formed on the first passivation layer and having a plurality of wiring units, wherein each of the wiring units comprises a conductive pad, a conductive via disposed in one of the first openings and a conductive trace connecting the conductive pad and the conductive via, the conductive trace having at least a first through opening for exposing a portion of the first passivation layer; and
   a second passivation layer formed on the first passivation layer and the redistribution layer and filled in the first through opening of the conductive trace of each of the wiring units and having a plurality of second openings for exposing the conductive pad of each of the wiring units,
   wherein the redistribution layer is comprised of a seed layer and a metal layer disposed in sequence, and
   the conductive trace has a widened portion and two elongated portions connecting the widened portion to the conductive pad and the conductive via, respectively, the first through opening being formed in the widened portion.

2. The structure of claim 1, wherein the at least a first through opening is of a polygonal shape, an elliptical shape, a circular shape or a plum blossom shape.

3. The structure of claim 1, further comprising at least a second through opening formed in the elongated portion between the widened portion and the conductive via or formed in the elongated portion between the widened portion and the conductive pad.

4. The structure of claim 3, wherein the at least second through opening is of a polygonal shape, an elliptical shape, a circular shape or a plum blossom shape.

* * * * *